(12) United States Patent
Kwak et al.

(10) Patent No.: US 12,191,317 B2
(45) Date of Patent: *Jan. 7, 2025

(54) DISPLAY DEVICE (71) Applicant: SAMSUNG DISPLAY CO., LTD., Yongin-si (KR)

(72) Inventors: Won Kyu Kwak, Seongnam-si (KR); Jae Yong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 514 days.

This patent is subject to a terminal disclaimer.

(21) Appl. No.: 17/452,246

(22) Filed: Oct. 26, 2021

(65) Prior Publication Data

US 2022/0045108 A1 Feb. 10, 2022

Related U.S. Application Data (60) Continuation of application No. 16/547,060, filed on Aug. 21, 2019, now Pat. No. 11,158,655, which is a (Continued)

(30) Foreign Application Priority Data

Aug. 11, 2015 (KR) .......................... 10-2015-0113265

(51) Int. Cl.
*H01L 27/12* (2006.01)
*H10K 59/131* (2023.01)
(Continued)

(52) U.S. Cl.
CPC ....... *H01L 27/1244* (2013.01); *H10K 59/131* (2023.02); *H10K 77/111* (2023.02); *H10K 2102/311* (2023.02); *Y02E 10/549* (2013.01)

(58) Field of Classification Search
CPC .................. H01L 27/1244; H10K 59/131; H10K 77/111; H10K 2102/311; H10K 59/12; Y02E 10/549
See application file for complete search history.

(56) References Cited

U.S. PATENT DOCUMENTS 10,483,291 B2  11/2019  Kwak et al.
11,158,655 B2 * 10/2021  Kwak .................. H10K 59/131
(Continued)

FOREIGN PATENT DOCUMENTS

KR  10-2000-0009438  2/2000
KR  10-2005-0042523  5/2005
(Continued)

*Primary Examiner* — Joe Schoenholtz
(74) *Attorney, Agent, or Firm* — F. CHAU & ASSOCIATES, LLC (57) ABSTRACT

A display device is disclosed. In one aspect, the display device includes a substrate including a display area, the display area including a plurality of pixels configured to display an image and a pad area adjacent to the pad area and configured to transfer electrical signals. At least a portion of the pad area is bendable. The display device also includes an insulating layer formed over the substrate and including a bending groove in the pad area. The bending groove includes a sidewall. A plurality of peripheral wires is formed over the insulating layer, and a cutoff portion is connected to the sidewall and disposed between adjacent peripheral wires.

9 Claims, 9 Drawing Sheets

Related U.S. Application Data division of application No. 15/215,858, filed on Jul. 21, 2016, now Pat. No. 10,483,291.

(51) Int. Cl.
*H10K 77/10* (2023.01)
*H10K 102/00* (2023.01)

(56) References Cited

U.S. PATENT DOCUMENTS

| | | |
|---|---|---|
| 2014/0353670 A1 | 12/2014 | Youn et al. |
| 2015/0179728 A1 | 6/2015 | Kwon et al. |
| 2016/0100483 A1 | 4/2016 | Hwang et al. |
| 2017/0047357 A1* | 2/2017 | Kwak .................. H10K 77/111 |
| 2019/0378860 A1 | 12/2019 | Kwak et al. |
| 2022/0231108 A1* | 7/2022 | Zhou .................. H01L 27/1244 |

FOREIGN PATENT DOCUMENTS

| | | |
|---|---|---|
| KR | 10-2005-0051300 | 6/2005 |
| KR | 10-2011-0054156 | 5/2011 |

* cited by examiner

DISPLAY DEVICE

RELATED APPLICATIONS

This application claims priority to and the benefit of Korean Patent Application No. 10-2015-0113265 filed in the Korean Intellectual Property Office on Aug. 11, 2015, U.S. patent application Ser. No. 15/215,858 filed on Jul. 21, 2016, and U.S. patent application Ser. No. 16/547,060 filed on Aug. 21, 2019, the entire contents of which are incorporated by reference herein.

BACKGROUND

Field

The described technology generally relates to a display device.

Description of the Related Technology

Display devices like liquid crystal display (LCD), plasma display device (PDP), organic light-emitting diode (OLED) display, electric field effect display, electrophoretic display are facing increased market demand.

Such devices include a display panel displaying an image by emitting a plurality of color lights and a window disposed on the display panel and protecting the display panel. Great strides are being made by further including a touch panel which provides for receiving an input signal by human touch or a handheld input device (e.g., stylus).

At this time, a driving chip is mounted at the periphery of the display panel to drive the display panel by transferring a touch signal in order to emit light using the display panel. To electrically connect to the display panel and the driving chip, a pad electrode is formed on a part of the display panel. The pad electrode is formed of a conductive material to electrically connect the display panel and the driving chip.

Market demand for display device with larger display areas is increasing, and manufacturers are developing display devices that can decrease the ratio of the pad area to display area and increase performance of the display.

SUMMARY

One inventive aspect relates to a display device that can decrease an pad area of the display device and prevent a short circuit between the wires.

Another aspect includes a display device with a substrate including a display area including a plurality of pixels so as to display an image and a pad area transferring electrical signals is provided, wherein a part of the pad area can be bent, an insulating layer formed on the substrate and including a bending groove in the pad area, a plurality of peripheral wires formed on the insulating layers, and a cutoff portion protruded or dented from a sidewall of the bending groove and disposed between the plurality of peripheral wires adjacent each other.

The bending groove is disposed at the insulating layer along a direction crossing a length direction in which the peripheral wires are extended. The cutoff portion is disposed at the same layer as the insulating layer.

The cutoff portion is formed of the same material as the insulating layer. The cutoff portion is integrally formed with the insulating layer.

A width of the cutoff portion is constant from the sidewall to an end of the cutoff portion.

A width of the cutoff portion is decreased from the sidewall to an end of the cutoff portion.

The display area includes a display wire extended from the pixel to the pad area, wherein an end of the peripheral wire contacts the display wire by a first contact hole.

The pad area includes a pad electrode and a pad wire, the other end of the peripheral wire contacts the pad wire by a second contact hole, and the pad electrode contacts the pad wire by a pad contact hole.

The display area is connected with the display wire and includes a thin film transistor including a gate electrode, a source electrode, and a drain electrode, and the display wire is made of the same material as the gate electrode and the peripheral wire is made of the same material as the source electrode and the drain electrode.

The cutoff portion has a plurality of protrusions protruding from the sidewall to an edge of the pad area at the substrate.

The cutoff portion has a plurality of recesses recessed from the sidewall to an edge of the pad area at the substrate.

The cutoff portion height is equal to or lower than that of the insulating layer.

Another aspect is a display device comprising: a substrate including a display area, the display area including a plurality of pixels configured to display an image and a pad area adjacent to the pad area and configured to transfer electrical signals, wherein at least a portion of the pad area is bendable; an insulating layer formed over the substrate and including a bending groove in the pad area, wherein the bending groove includes a sidewall; a plurality of peripheral wires formed over the insulating layer; and a cutoff portion connected to the sidewall and disposed between adjacent peripheral wires.

In the above display device, the bending groove extends in a direction crossing a direction in which the peripheral wires extends.

In the above display device, the cutoff portion is formed on the same layer as the insulating layer.

In the above display device, the cutoff portion is formed of the same material as the insulating layer.

In the above display device, the cutoff portion is integrally formed with the insulating layer.

In the above display device, the width of the cutoff portion is substantially the same from the sidewall to an end region of the cutoff portion.

In the above display device, the width of the cutoff portion decreases from the sidewall to an end of the cutoff portion.

In the above display device, the display area includes a display wire extending from the pixel to the pad area, wherein an end region of the peripheral wire contacts the display wire through a first contact hole.

In the above display device, the pad area includes a pad electrode and a pad wire, wherein the other end of the peripheral wire contacts the pad wire through a second contact hole, and wherein the pad electrode contacts the pad wire through a pad contact hole.

In the above display device, the display area is connected to the display wire and includes a thin film transistor comprising a gate electrode, a source electrode, and a drain electrode, wherein the display wire is formed of the same material as the gate electrode, and wherein the peripheral wire is formed of the same material as the source and drain electrodes.

In the above display device, the cutoff portion includes a plurality of protrusions protruding from the sidewall to an edge of the pad area.

In the above display device, the cutoff portion has a plurality of recesses recessed from the sidewall to an edge of the pad area.

In the above display device, the height of the cutoff portion is substantially equal to or less than that of the insulating layer.

Another aspect is a display device comprising: a substrate including a display area configured to display an image and a pad area adjacent to the pad area and configured to transfer electrical signals to the display area, wherein a portion of the pad area is bendable; an insulating layer formed over the substrate and including a bending groove formed in the pad area, wherein the bending groove includes a sidewall; a plurality of display wires formed in the display area; a plurality of peripheral wires formed in the peripheral area and electrically connected to the display wires; and a cutoff portion extending from the sidewall into the display area or protruding from the insulation layer in the display area into the sidewall in the peripheral area, wherein the cutoff portion is interposed between adjacent peripheral wires.

In the above display device, the height of the bending groove is less than that of the rest of the insulating layer.

In the above display device, the cutoff portion is substantially rectangular.

In the above display device, a selected display wire and a selected peripheral wire overlap in an overlap region in the display area, wherein the overlap region has a length that is less than that of the cutoff portion.

In the above display device, the cutoff portion is substantially triangular.

In the above display device, the sidewall overlaps a selected peripheral wire in the depth dimension of the display device.

In the above display device, the width of the cutoff portion is less than the width of the peripheral wire.

According to at least one of the disclosed embodiments, a display device, which can decrease a probability of damage to the display device because of a modulus difference of each of insulation layers formed by stacking a plurality of layers in a bending groove formed by removing a part of the insulating layer corresponding to a bending area of a pad area of the display device when the display device is bent, is provided.

In addition, a display device reducing a probability of a short-circuit between a plurality of peripheral wires by the cutoff portion is provided.

DETAILED DESCRIPTION OF CERTAIN INVENTIVE EMBODIMENTS

Hereinafter, referring to the drawings, exemplary embodiments will be described in detail. However, in describing the present technology, a description of already known functions or configurations will be omitted so as to make the subject matter of the present technology more clear.

Parts unrelated to the description of the exemplary embodiments are not shown in the drawings to make the descriptions more clear, and like reference numerals designate like element throughout the specification. In addition, the size and thickness of each configuration shown in the drawings are arbitrarily shown for better understanding and ease of description, but the present technology is not limited thereto.

In the drawings, the thickness of layers, films, panels, regions, etc., are exaggerated for clarity. In the drawings, for understanding and ease of description, the thickness of some layers and areas is exaggerated. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 1:
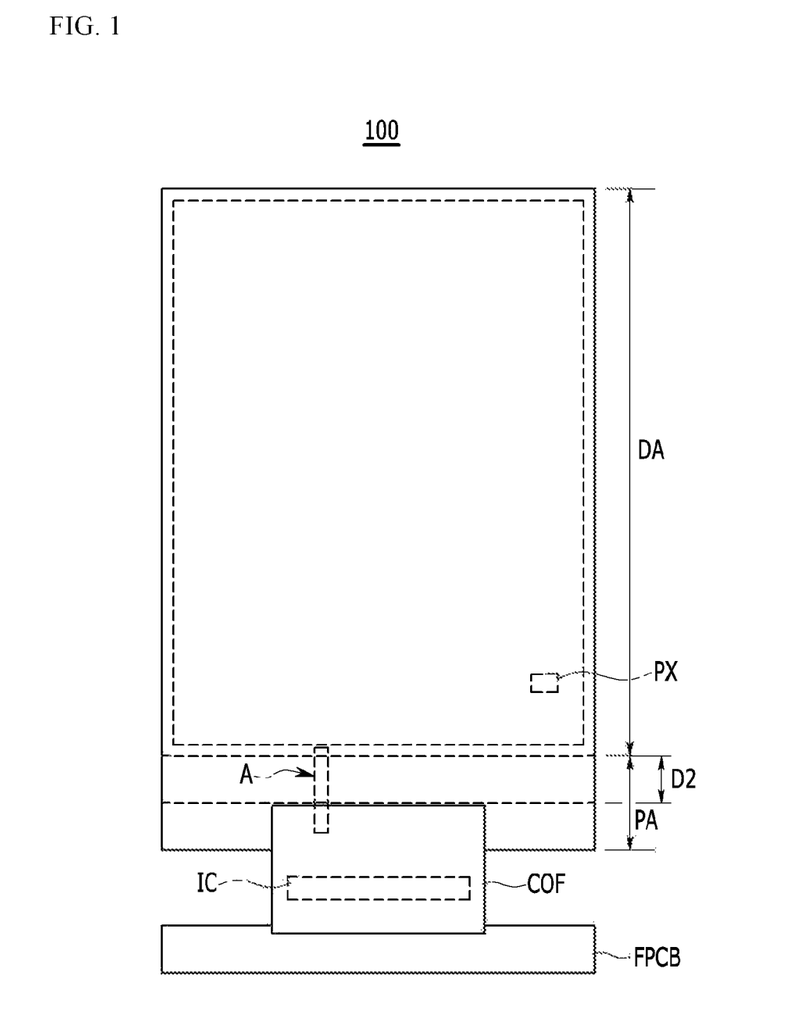
FIG. 1 illustrates a top plan view of a display device according to an exemplary embodiment.
Figure 2:
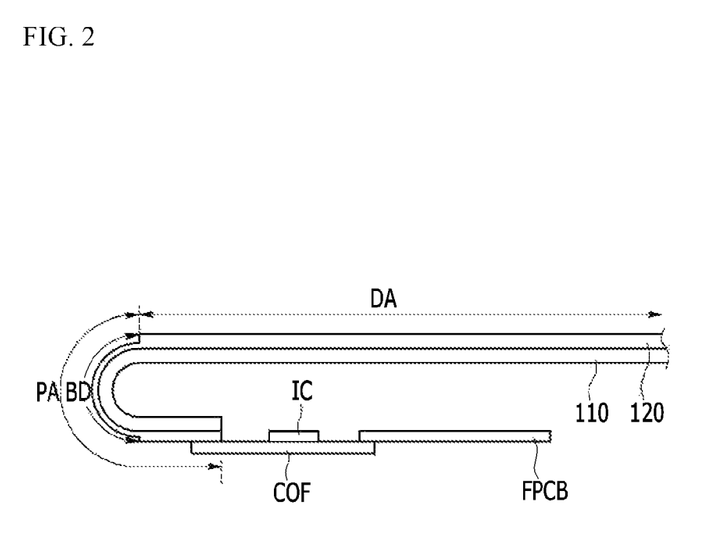
FIG. 2 illustrates a side view showing a bending state of the display device of an exemplary embodiment.

FIG. 1 illustrates a top plan view of a display device 100 according to an exemplary embodiment. FIG. 2 illustrates a side view showing a bending state of the display device 100 of an exemplary embodiment.

A display device 100 according to an exemplary embodiment includes a substrate 110, an insulating layer 120, a plurality of peripheral wires 124, and a cutoff portion 126.

As Illustrated in FIG. 1, the substrate 110 of the present exemplary embodiment includes a display area DA and a pad area PA which are distinguishable by each of their functions. The display area DA is an area formed in an area of the substrate 110 and including a plurality of pixels PX so as to display images, and the pad area PA is an area receiving electrical signals transferred from the outside to the display area by being electrically connected with a chip on film COF and a flexible printed circuit board FPCB.

The substrate 110 according to the present exemplary embodiment can be a plastic film formed of a flexible material like polyimide or polycarbonate. Therefore, the substrate 110 of the present exemplary embodiment can allow a part of the pad area PA to be bent as illustrated in FIG. 2.

The insulating layer 120 is formed on the substrate 110 of the present exemplary embodiment. The insulating layer 120 protects the substrate 110 by preventing moisture and oxygen from permeating from the outside. The insulating layer 120 is formed by stacking organic layers or inorganic layers, or by alternately stacking an organic layer and an inorganic layer.

For example, the insulating layer 120 of the present exemplary embodiment includes a barrier layer 120a, a buffer layer (not shown), gate insulating layers 120b and 120c, and an interlayer insulating layer 120d on the substrate 110.

The barrier layer 120a is formed by stacking a plurality of organic layers or inorganic layers, or by alternately stacking an organic layer and an inorganic layer. The barrier layer 120a is formed of a material having lower moisture permeability and oxygen transmittance than the substrate 110, so that the moisture and oxygen permeating the substrate 110 cannot permeate a light emitting element 30. Regarding the light emitting element 30, it is described for example below in a part relating to FIG. 9.

The buffer layer (not shown) is also formed by stacked a plurality of organic layers or inorganic layers, like the barrier layer 120a. The buffer layer provides a substantially flat surface in order to form a pixel circuit at the light emitting element 30 in the display area DA and prevent the moisture and the impurities from permeating into the pixel circuit and the light emitting element 30.

The gate insulating layers 120b and 120c are formed on the buffer layer by an organic layer or an inorganic layer so that gate wires including a gate line (not shown), a gate electrode 32, and a gate pad (not shown) are insulated from conductive materials of other layers. Although not illustrated in the drawings, the gate line of the present exemplary embodiment includes a first gate line and a second gate line formed in a different layer from the first gate line, such that the first gate insulating layer 120b and the second gate insulating layer 120c are formed to correspond to the first gate line and the second gate line.

The interlayer insulating layer 120d is formed on the gate insulating layers 120b and 120c and is mainly formed by an organic layer, but is not limited thereto. The interlayer insulating layer 120d is formed between a data wire including a data line (not shown), a data pad (not shown), a source electrode 33, and a drain electrode 34, and the gate wire, so that the interlayer insulating layer 120d insulates the gate wire and the data wire from each other.

When a typical display device is bent, problems can occur such as damage to the display device when the display device is bent or a large modulus difference which can make the display device not easily bent between each of the layers because a thickness of the insulating layer is too thick by stacking a plurality of organic layers or inorganic layers.

Thus, the display device 100 of the present exemplary embodiment includes a bending groove BD formed by removing a part of the insulating layer 120 corresponding to a bending area of the display device 100. Because the bending groove BD is formed by removing a part of the insulating layer 120, a sidewall 128 can be formed by a step with the insulating layer 120 which is not removed.

In this case, the bending groove BD of the present exemplary embodiment can be formed by removing a part of the barrier layer 120a, the buffer layer (not shown), the gate insulating layers 120b and 120c, and the interlayer insulating layer 120d included in the insulating layer 120, or all of the insulating layer 120 in order to expose the substrate 110.

Figure 4:
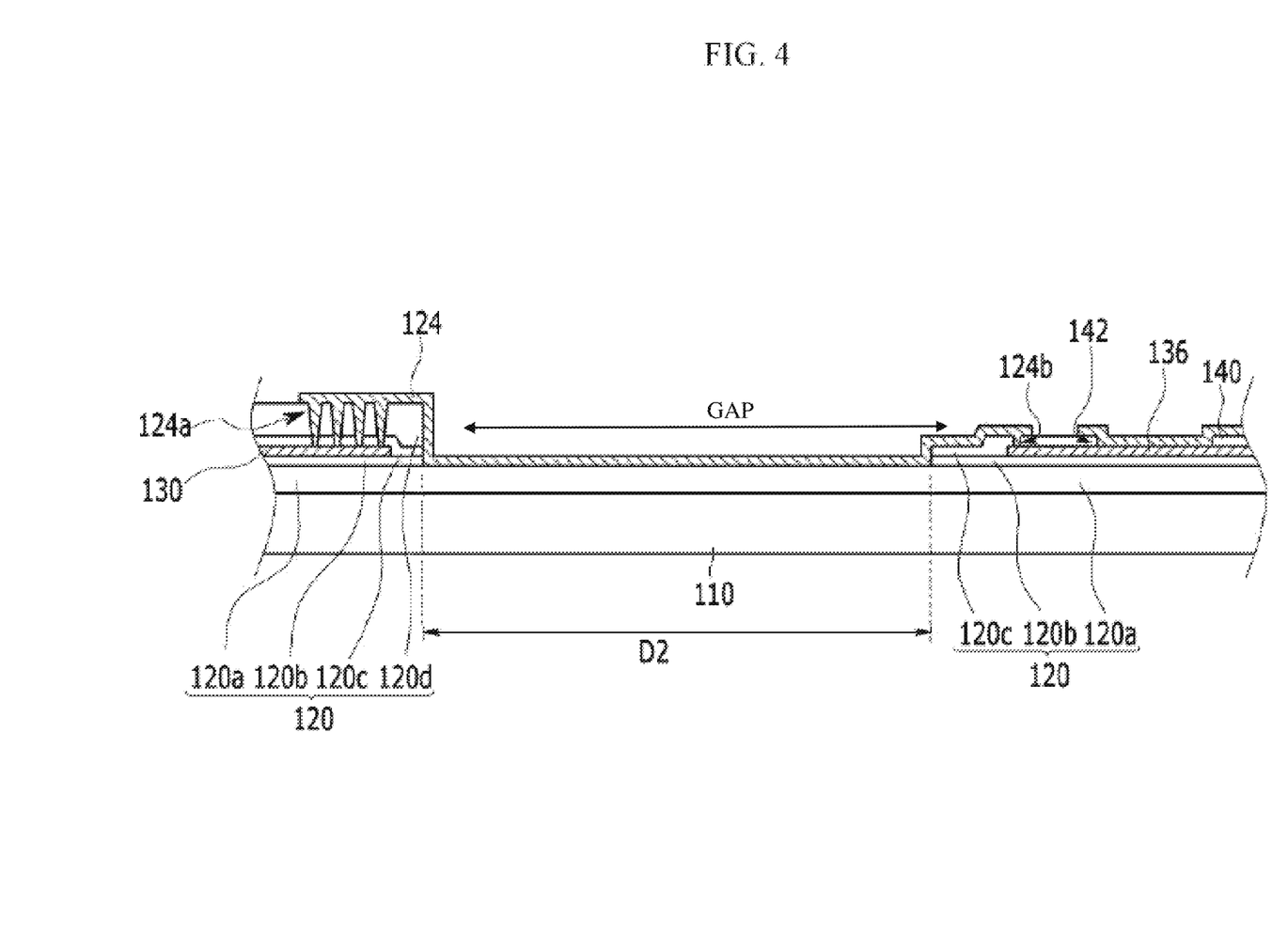
FIG. 4 illustrates a cross-sectional view cutting along an IV-IV line in FIG. 3.

FIG. 2 and FIG. 4 illustrate the bending groove BD formed by removing the buffer layer, the gate insulating layers 120b and 120c, and the interlayer insulating layer 120d and maintaining the barrier layer 120a among the insulating layer 120.

However, this embodiment is just one example, and it is possible that only the barrier layer 120a can be removed or only the interlayer insulating layer 120d can be removed while maintaining the buffer layer (not shown) or gate insulating layers 120b and 120c, as described above.

The cutoff portion 126 is formed at the sidewall of the bending groove BD. The cutoff portion 126 protrudes or is recessed from the sidewall 128 of the bending groove BD to an edge of the pad area at the substrate forming a plurality of recess portions.

Figure 3:
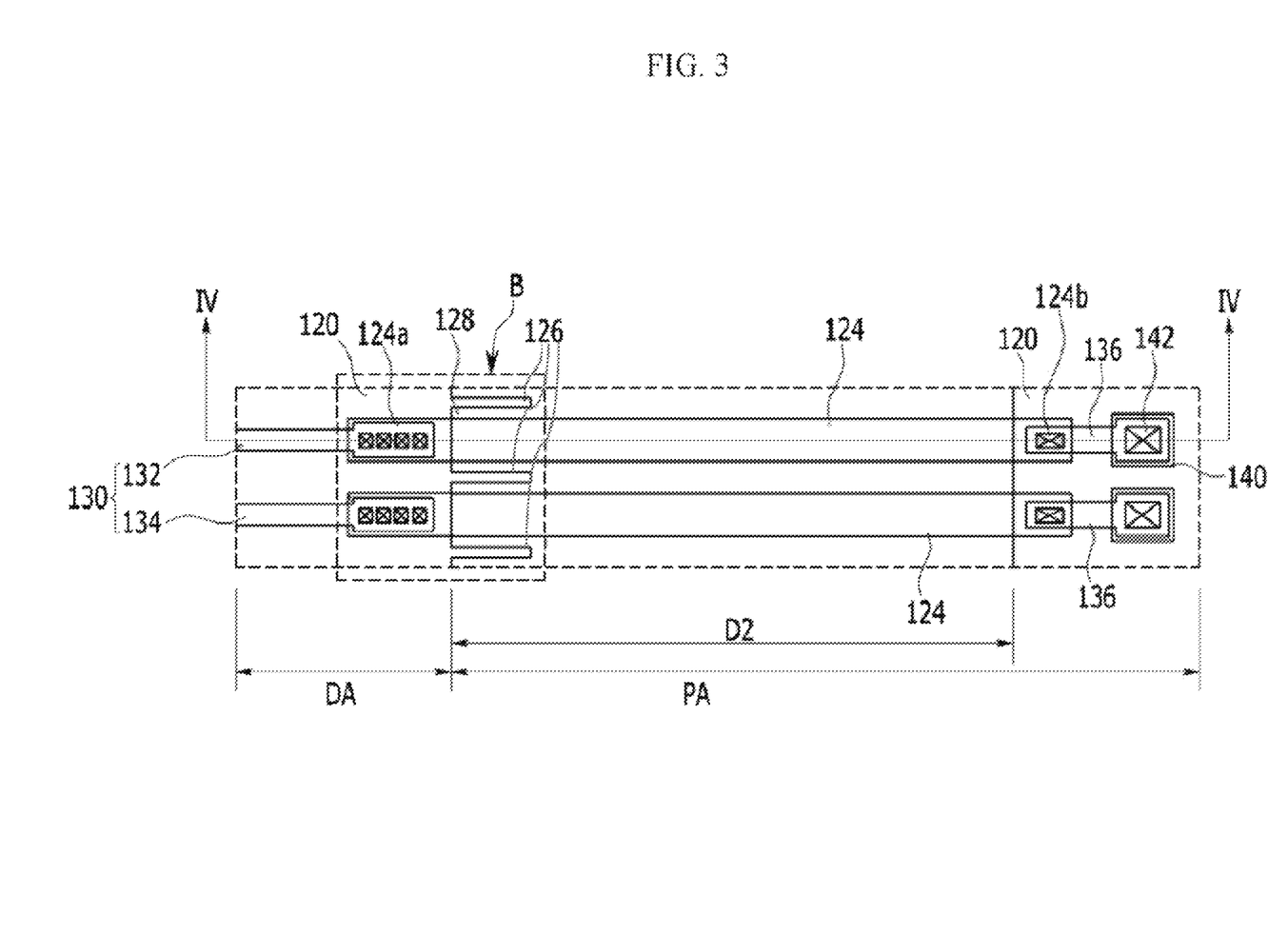
FIG. 3 illustrates an enlarged view of an A area in FIG. 1 of the display device according to a first exemplary embodiment.

FIG. 3 illustrates a part of the pad area PA and the display area DA including a cutoff portion 126 protruding from the sidewall 128 of the bending groove BD according to a first exemplary embodiment. FIG. 4 illustrates a cross-sectional view cutting along an IV-IV line in FIG. 3.

The word "protrude" can mean that the cutoff portion 126 extends toward the edge in a pad area PA of the substrate 110. For example, it means that the cutoff portion 126 extends toward an empty space that is opened by removing the insulating layer 120 at the bending groove BD from the sidewall 128 of the bending groove BD that is maintained in the insulating layer 120.

A plurality of peripheral wires 124 are formed on the insulating layer 120 including the bending groove BD of the present exemplary embodiment. The peripheral wires 124 electrically connect a plurality of display wires in a display area DA and a plurality of pad electrodes 140 in a pad area PA.

As illustrated in FIG. 3 and FIG. 4, an end of the peripheral wire 124 is electrically connected with a display wire 130 by contacting through a first contact hole 124a, and the other end of the peripheral wire 124 is electrically connected with a pad wire 136 in the pad area PA by contacting through a second contact hole 124b.

The pad wire 136 contacts a pad contact hole 142 and is connected with the pad electrode 140. The display wire 130 of the present exemplary embodiment is formed of the same material as the gate wire as described above, and the peripheral wire 124 of the present exemplary embodiment is formed of the same material as the data wire as described above.

For example, the display wire 130 includes a first display wire 132 and a second display wire 134 formed on a different layer from the first display layer 132, and the first display wire 132 and the second display wire 134 are formed on the same layer and formed of the same material as a first gate line and a second gate line formed on a different layer from the first gate line, respectively.

However, it is not limited thereto, and the implemental range of the described technology is not limited even if the peripheral wire 124 is formed of the same material as the gate wire. After forming the display wire 130 and the peripheral wire 124, a material for forming an electrode like a pixel electrode 371 or a common electrode 373 can be added in order to form a pixel in the display area DA as described regarding FIG. 9.

In this case, the material for forming the electrode that is not removed can remain in the lower side of the bending groove BD in which a step is formed because the material for forming the electrode is not only applied on the display area (DA) but also on all of the substrate 110.

If the material for forming the electrode remains in the bending groove BD, the short circuit phenomenon occurs by connecting the peripheral wires 124 by the remaining material for forming the electrode in the insulating layer 120 including the groove BD, so that the product can have a defect. Therefore, according to the present exemplary embodiment, a plurality of cutoff portions 126 are formed to prevent the material for forming the electrode from remaining in the bending groove BD.

The plurality of cutoff portions 126 according to the present exemplary embodiment are formed between each of the peripheral wires 124, so that the cutoff portions 126 extend the circumferential length of the sidewall 128 of the bending groove BD against the case where the cutoff portion 126 is not formed.

The material for forming the electrode does not remain between the peripheral wires 124, so that the short-circuit phenomenon between the peripheral wires 124 can be prevented because the probability that the material for forming the electrode remains on the sidewall 128 in the bending groove BD can decrease by extending the circumferential length of the sidewall 128.

The cutoff portion 126 of the present exemplary embodiment can be formed of the same material as the insulating layer 120 and be formed integrally with the insulating layer 120.

When a part of the insulating layer 120 is removed to form the bending groove BD (as indicated by gap area GAP), the bending groove BD can be formed by using a mask corresponding to a shape of the cutoff portion 126 in order to be formed the cutoff 126 at the sidewall 128.

In addition, although not illustrated in the drawings, the cutoff portion 126 of the present exemplary embodiment has the same or a lower height than the sidewall 128 of the bending groove BD.

For example, when the insulating layer 120 is removed to form the bending groove BD indicated by gap area GAP, the cutoff portion 126 is formed by removing the insulating layer 120 having the same or a lower height than the bending groove BD.

As an example, if the interlayer insulating layer 120d, the gate insulating layers 120b and 120c, and the buffer layer among the insulating layer 120 are removed to form the bending groove BD indicated by gap area GAP, not only can all of the interlayer insulating layer 120d, the gate insulating layers 120b and 120c, and the buffer layer cutoff portion 126 be removed to form the bending groove BD, but only the interlayer insulating layer 120d can be removed or only the interlayer insulating layer 120d and the gate insulating layers 120b and 120c can be removed that form the gap area GAP.

FIG. 5 to FIG. 8 illustrate various exemplary embodiments of the cutoff portion 126 according to the first exemplary embodiment to the fourth exemplary embodiment.

Figure 5:
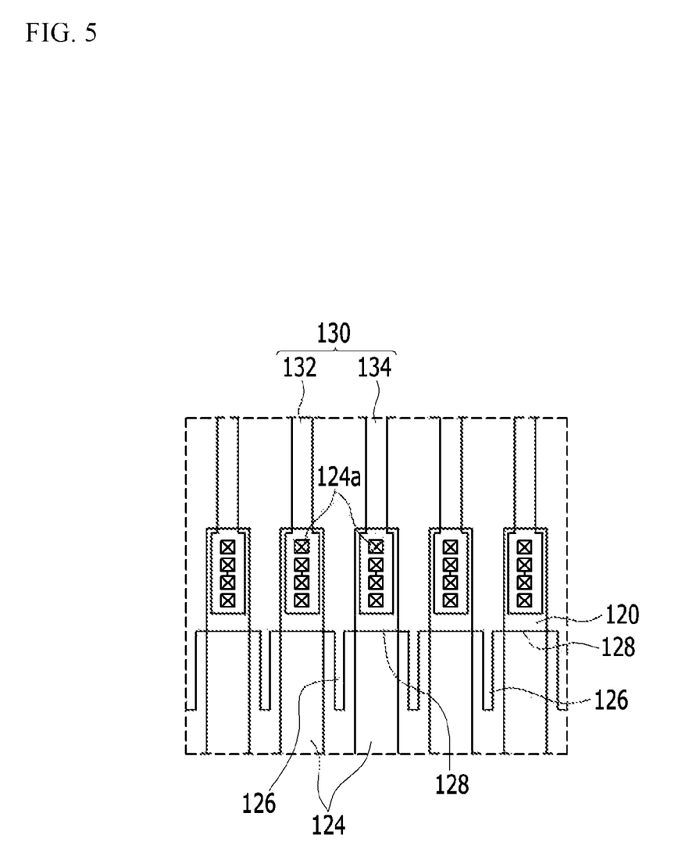
FIG. 5 illustrates an enlarged view of a B area in FIG. 3.
Figure 6:
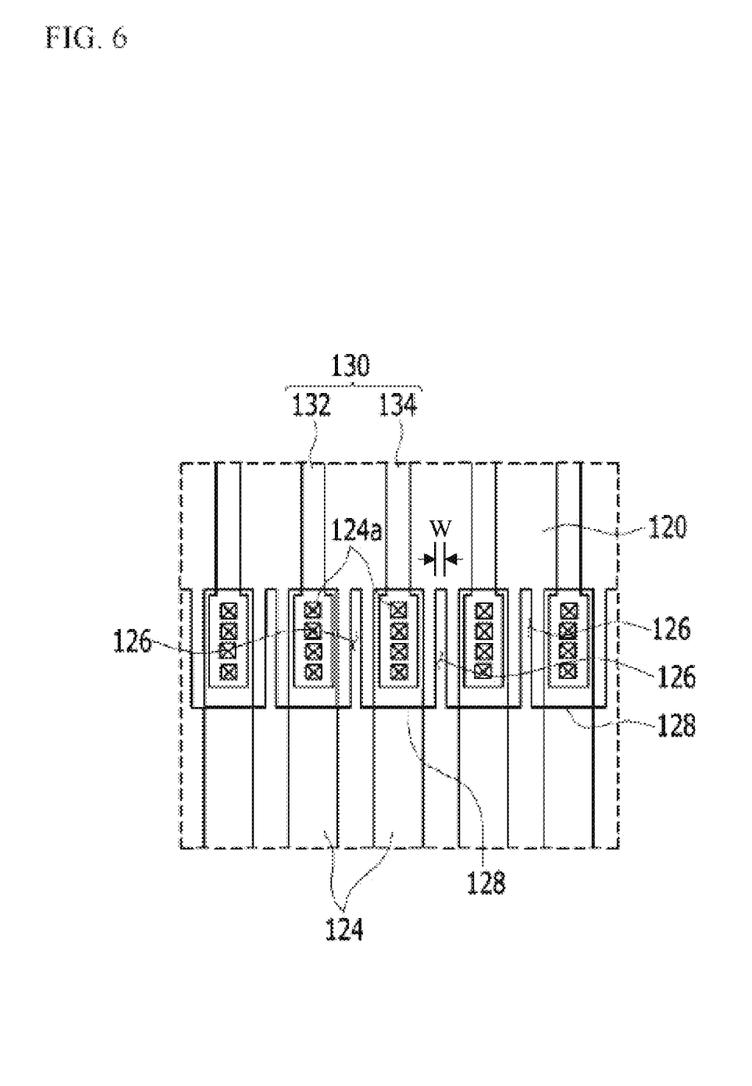
FIG. 6 illustrates an enlarged view of the B area in FIG. 3 of the display device according to a second exemplary embodiment.
Figure 7:
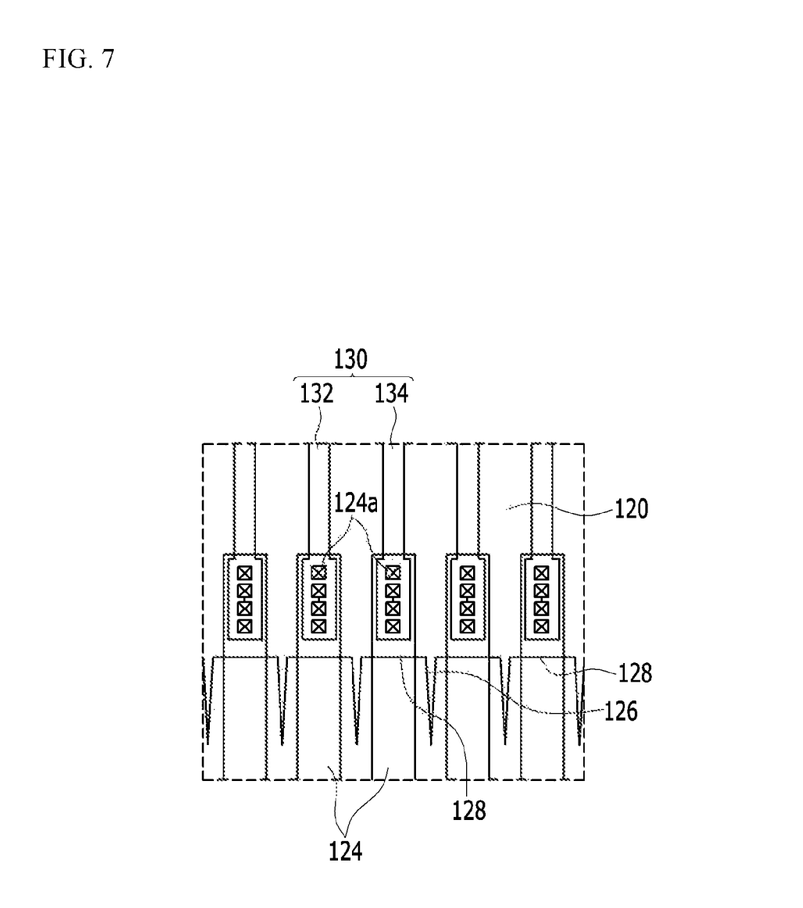
FIG. 7 illustrates an enlarged view of the B area in FIG. 3 of the display device according to a third exemplary embodiment.
Figure 8:
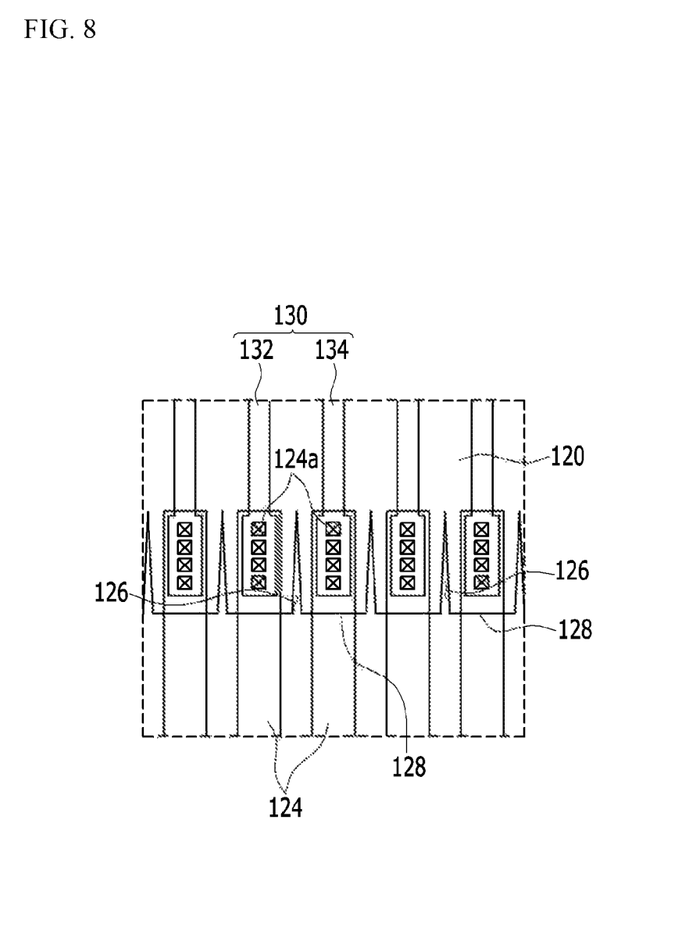
FIG. 8 illustrates an enlarged view of the B area in FIG. 3 of the display device according to a fourth exemplary embodiment.

FIG. 5 illustrates an enlarged view of a B area and a periphery of the B area in FIG. 3. FIG. 6 to FIG. 8 illustrate other exemplary embodiments that are deformable at a position corresponding to FIG. 5.

As illustrated in FIG. 5, the cutoff portion 126 according to the first exemplary embodiment is formed as the insulating layer 120 protrudes from the sidewall 128 of the bending groove BD toward the pad electrode 140.

This is identical to that described regarding FIG. 3 and FIG. 4. Meanwhile, FIG. 6 illustrates the cutoff portion 126 according to the second exemplary embodiment.

According to the second exemplary embodiment, the cutoff portion 126 is formed as the insulating layer 120 is dented from the sidewall 128 of the bending groove BD toward the pad electrode 140.

As illustrated in FIG. 5 and FIG. 6, the width of the cutoff portion 126 (i.e., width W) according to the first exemplary embodiment and the second exemplary embodiment is kept constant from the sidewall 128 to the end of the cutoff portion 126.

FIG. 7 illustrates the cutoff portion 126 according to the third exemplary embodiment. FIG. 7 illustrates the cutoff portion 126 formed as the insulating layer 120 protrudes from the sidewall 128 of the bending groove BD toward the pad electrode 140, like the first exemplary embodiment.

However, according to the third exemplary embodiment, FIG. 7 illustrates that the width of the cutoff portion 126 is decreased from the sidewall 128 of the bending groove BD to the end of the cutoff portion 126, unlike the first exemplary embodiment.

FIG. 8 illustrates the cutoff portion 126 according to the fourth exemplary embodiment. The cutoff portion 126 illustrated in FIG. 8 is also formed as a part of the insulating layer 120 that is dented from the sidewall 128 of the bending groove BD toward the display area DA, like the second exemplary embodiment, and the width of the cutoff portion 126 is decreased from the sidewall 128 of the bending groove BD to the end of the cutoff portion 126, like the third exemplary embodiment.

Further, although not illustrated in the drawings, not only can a surface and an edge of the cutoff portion 126 be rounded, but it will be included in the exemplary range of the described technology that the lengths or the heights of a plurality of cutoff portions 126 are different from each other.

Figure 9:
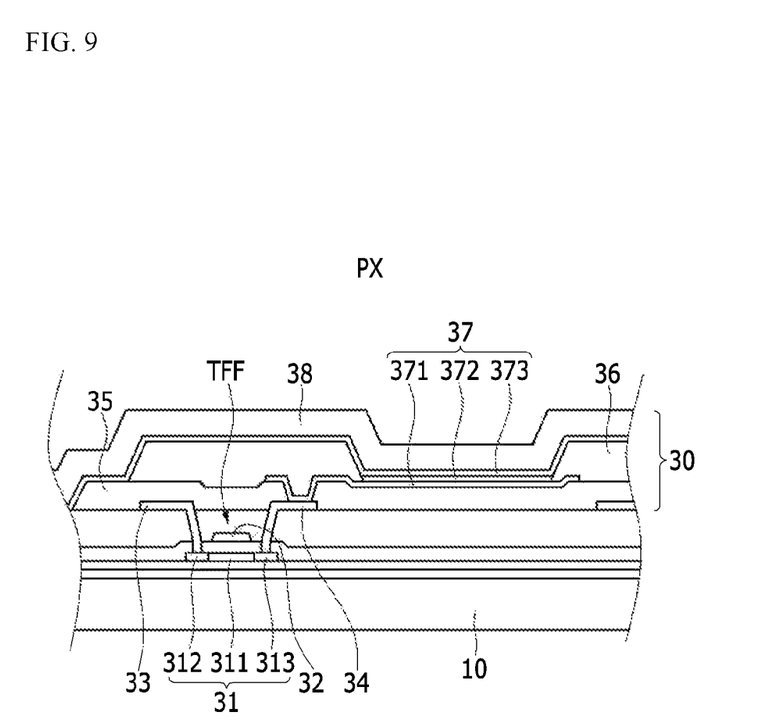
FIG. 9 illustrates a cross-sectional view showing a part of a pixel in a display area of the display device according to an exemplary embodiment.

Meanwhile, FIG. 9 illustrates a pixel PX in the display area DA of the display device 100 according to an exemplary embodiment.

In the pixel PX in FIG. 9, insulating layer 120 including the barrier layer 120a, the buffer layer, the gate insulating layers 120b and 120c, and the interlayer insulating layer 120d is formed on a substrate 110, and an organic emission layer 30 is formed on the insulating layer 120.

In this time, a semiconductor layer 31 including a channel region 311, a source region 312, and a drain region 313 is formed on the buffer layer, the gate insulating layers 120b and 120c cover the semiconductor layer 31, and the gate electrode 32 is formed on the gate insulating layers 120b and 120c corresponding to the channel region 311.

The interlayer insulating layer 120d covers the gate electrode 32, and a contact hole is formed in the interlayer insulating layer 120d so that the source electrode 33 and the drain electrode 34 are connected with the source region 312 and the drain region 313 of the semiconductor layer 31, respectively.

Then, a planarizing layer 35 is formed on the interlayer insulating layer 120d on which the source electrode 33 and the drain electrode 34 are formed in order to flatten the surface. Another contact hole is formed in the planarizing layer 35 so that the pixel electrode 371 and the drain electrode 34 contact each other. The source electrode 33, semiconductor layer 31, gate electrode 32, and drain electrode 34 can be thin film transistor TFF.

A pixel defining layer 36 opened at the area corresponding to the light emitting area of the pixel is formed on the planarizing layer 35. The pixel electrode 371, an organic emission layer 372, and the common electrode 373 are stacked sequentially in the opened area of the pixel defining layer 36 so that the organic light emitting element 37 is completed.

A thin film encapsulation layer 38 is formed on the organic light emitting element 37 to prevent the moisture and the oxygen from penetrating into the substrate 110 on which the organic light emitting element 37 is formed.

FIG. 9 illustrates an OLED display including the organic light emitting element 37 according to an exemplary embodiment. However, the described technology is not limited thereto, and it can be applied to various display devices like a liquid crystal display LCD, a plasma display panel PDP, a field effect display FED, and an electrophoretic display.

According to an exemplary embodiment, the display wire 130 is extended from the pixel PX to display area DA to the pad area PA. The display wire 130 is the gate line formed in the same layer and of the same material as the gate electrode 32 or the data line formed in the same layer and of the same material as the source electrode 33 and the drain electrode 34.

In addition, as described above, the gate line can be the first gate line and the second gate line formed at the different layers from each other. Therefore, the first display wire 132 and the second display wire 134 correspond not only to the first gate line and the second gate line, but also to the gate line and the data line.

Meanwhile, the pad wire 136 of the present exemplary embodiment formed in the pad area PA is also formed of the same material as the display wire 130, and the pad electrode 140 is formed of the same material as the peripheral wire 124.

Also, the material for forming the pixel electrode is formed on the pad electrode 140 to form the pixel electrode 371 of the display area DA. It is described above that the display device 100 includes a cutoff portion 126 corresponding to the first to fourth exemplary embodiments.

According to the present exemplary embodiment, it can decrease a probability of damage to the display device because of a modulus difference of each of the insulation layers formed by stacking a plurality of layers in a bending groove formed by removing a part of the insulating layer corresponding to a bending area of a pad area of the display device when the display device is bent.

In addition, it can reduce a probability of a short-circuit between the peripheral wires 124 through the pad area PA by forming the cutoff portion 126.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Therefore, changed examples and modified examples should not be appreciated separately from the technical spirit or the viewpoint of the described technology, and it should be appreciated that modified exemplary embodiments will be included in the appended claims of the described technology.

What is claimed is:

1. A display device comprising:
   a display area comprising a plurality of pixels on a substrate;
   a pad area on the substrate and adjacent to the display area;
   an insulating layer disposed on the substrate and comprising a plurality of recess portions in which a portion of the insulating layer is removed,
   wherein a recess portion comprises a region from which the portion of the insulating layer is removed that extends from the pad area to the display area;
   a plurality of peripheral wires disposed on the insulating layer,
   wherein the recess portion is disposed between adjacent peripheral wires, and
   the plurality of recess portions and the peripheral wires are alternately disposed one by one.

2. The display device of claim 1, wherein the insulating layer includes a gap area where the insulating layer is removed and that overlaps the pad area, and
   wherein the gap area extends in a direction crossing a direction in which the peripheral wires extend.

3. The display device of claim 1, wherein the display area includes a display wire extending from the pixel to the pad area, and wherein an end region of the peripheral wires contacts the display wire through a first contact hole.

4. The display device of claim 1, wherein the pad area includes a pad electrode and a pad wire, wherein another end of the peripheral wire contacts the pad wire through a second contact hole, and wherein the pad electrode contacts the pad wire through a pad contact hole.

5. The display device of claim 1, wherein the display area is connected to a display wire and includes a thin film transistor comprising a gate electrode, a source electrode, and a drain electrode, wherein the display wire is formed of the same material as the gate electrode, and wherein the peripheral wires are formed of the same material as the source and drain electrodes.

6. The display device of claim 1, wherein a height of the recess portion is substantially equal to or less than that of the insulating layer.

7. The display device of claim 1, wherein the substrate is flexible.

8. The display device of claim 1, wherein the recess portion is substantially rectangular.

9. The display device of claim 1, wherein a width of the recess portion is less than a width of the peripheral wires.

* * * * *